SWITCH FOR PROGRESSIVELY CONNECTING CIRCUITS IN PARALLEL

Filed Aug. 28, 1961 3 Sheets-Sheet 1

INVENTOR.
SAMUEL L. BROADHEAD JR.
BY
Moody and Kintzinger
ATTORNEYS

SWITCH FOR PROGRESSIVELY CONNECTING CIRCUITS IN PARALLEL

Filed Aug. 28, 1961 3 Sheets-Sheet 2

INVENTOR.
SAMUEL L. BROADHEAD JR.
BY
Moody and Kintzinger
ATTORNEYS

SWITCH FOR PROGRESSIVELY CONNECTING CIRCUITS IN PARALLEL

Filed Aug. 28, 1961 3 Sheets-Sheet 3

INVENTOR.
SAMUEL L. BROADHEAD JR.
BY
Woody and Kintzinger
ATTORNEYS

United States Patent Office 3,152,228

Patented Oct. 6, 1964

3,152,228
SWITCH FOR PROGRESSIVELY CONNECTING CIRCUITS IN PARALLEL

Samuel L. Broadhead, Jr., Cedar Rapids, Iowa, assignor to Collins Radio Company, Cedar Rapids, Iowa, a corporation of Iowa Filed Aug. 28, 1961, Ser. No. 134,445
6 Claims. (Cl. 200—11)

Figure 1:
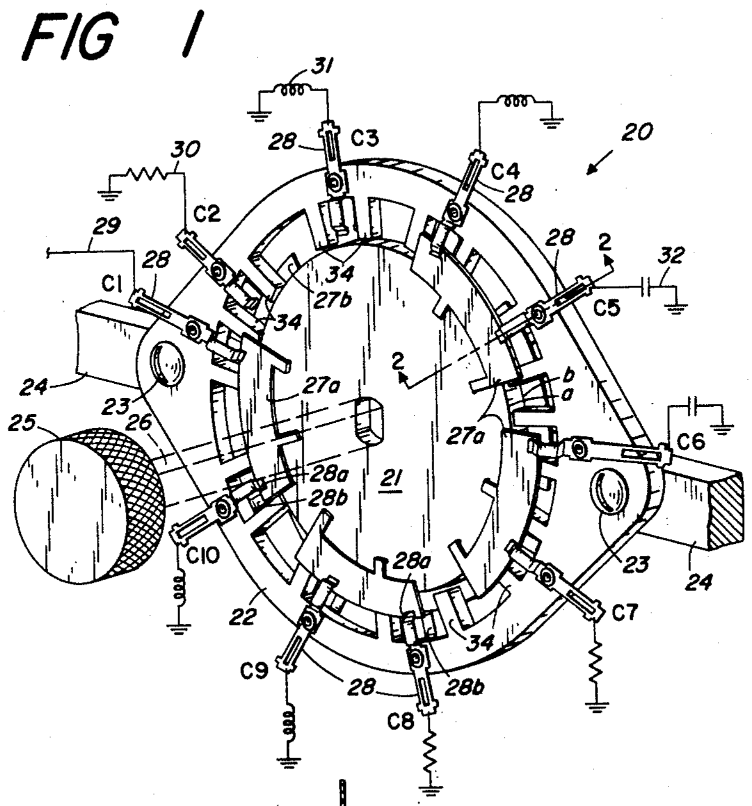

This invention relates to electric switches and is particularly concerned with switch means for progressively connecting, and for progressively disconnecting, circuits in parallel.

Tuning of radio frequencies may be accomplished by adding and removing capacitance by steps or by increasing and decreasing inductance by steps. Many tuning circuits have separate capacitors or coils which are individually and selectively connected to give the required capacitance or inductance for a selected predetermined tuned frequency. With the capacitance values required for some tuned frequencies individual capacitors must be, obviously, quite large. A single capacitor, or coil, providing the required capacitance, or inductance, for a precisely tuned radio frequency, is subject to close tolerance limitations. Component size and tolerance requirements may be minimized by progressively connecting additional capacitors, or coils, in parallel, but this requires a reliable system for doing so.

It is, therefore, a principal object of this invention to provide for progressively connecting circuits in parallel.

Another object is to provide continuously rotatable switch means for progressively adding subcircuits in parallel through successive 360° rotational cycles with all switch positions usable.

A further object is to minimize the size of individual components, such as capacitors, by progressively connecting or disconnecting them in parallel for increasing and decreasing capacity of a circuit.

Another object is to minimize tolerance requirements of electrical components.

Features of this invention useful in accomplishing the above objects include a 360° rotary switch having two relatively movable nonconductive switch elements; one a rotor, multiple conductive members mounted in two parallel paths on the rotor, and multiple contactors mounted on the other switch element. The multiple conductive members are arcuate conductive plates arranged in two planes with plates in one plane overlapping adjacent end-to-end plates in the other plane. Bridging contactors provide for periodically connecting overlapping plates between the two planes and for adding individual circuits, of each contactor, successively to the circuit each time the switch rotor is turned a predetermined number of degrees.

A specific embodiment representing what is presently regarded as the best mode of carrying out the invention is illustrated in the accompanying drawings.

Figure 2:
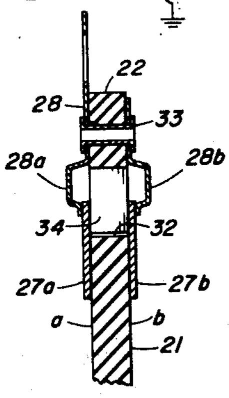
Figure 3:
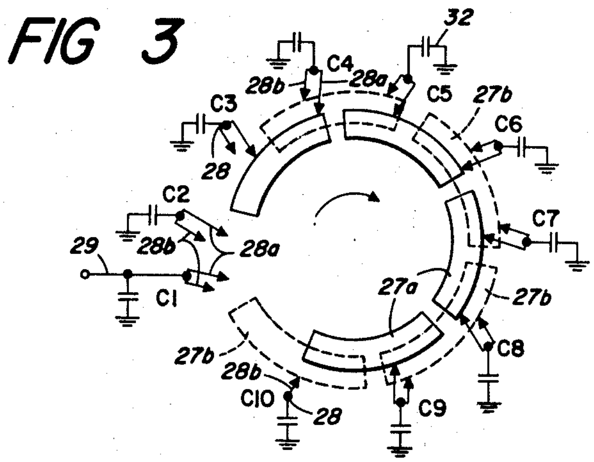
Figure 4:
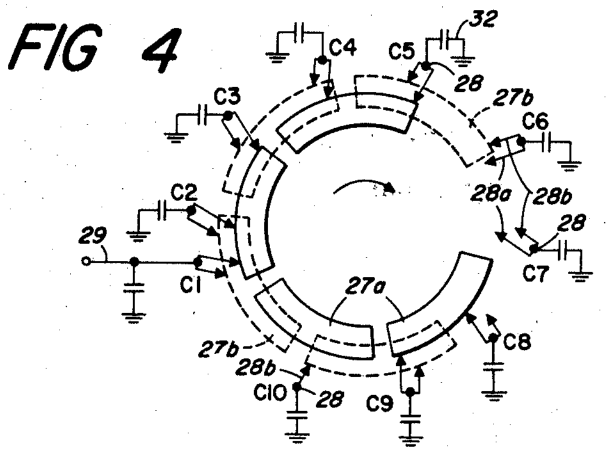
Figure 5:
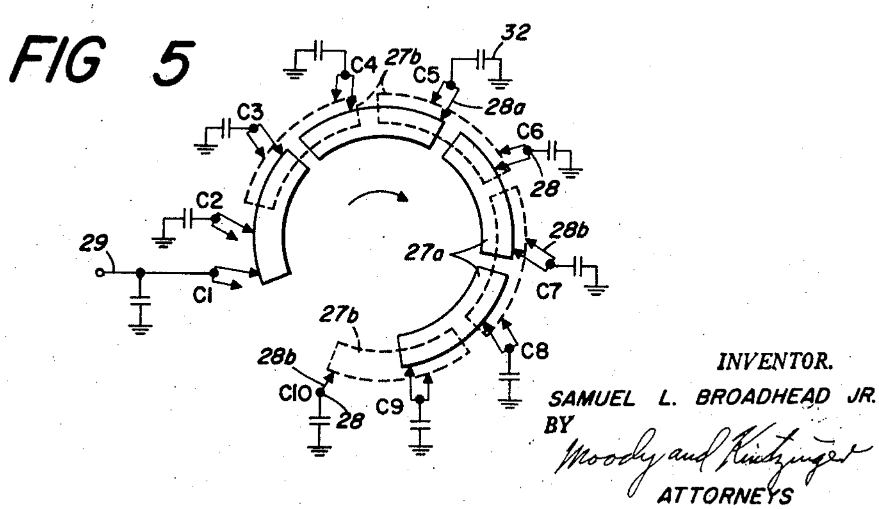
Figure 6:
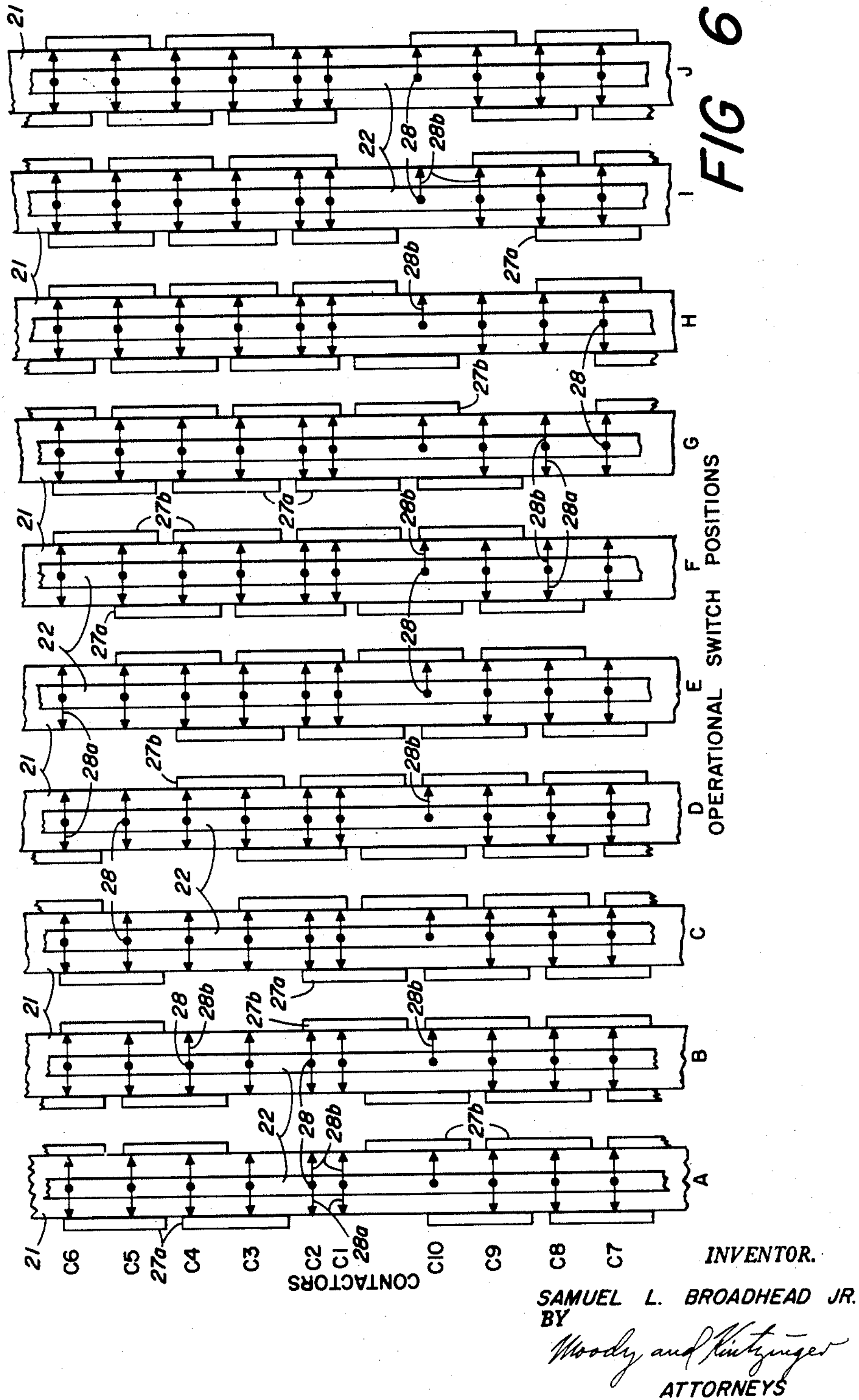

In the drawings:

FIGURE 1 represents a perspective view of an improved wafer switch showing how it could be mounted in a chassis, the relationship of the cooperating members, and schematically, typical circuit connections;

FIGURE 2, a fragmentary view taken from line 2—2 of FIGURE 1 showing switch conductive plate and bridging contactor detail;

FIGURES 3, 4, and 5, schematically illustrate, a switch position with no subcircuits connected to the common circuit, a switch position with five capacitive subcircuits added to the capacitance of the common circuit, and a position with nine capacitive subcircuits added to the capacitance of the common circuit, respectively; and FIGURE 6, a schematic diagram of ten operational switch positions showing the corresponding conductive plate and contactor states.

Referring to the drawings, a multiposition wafer type switch 20 having a rotor 21 and an outer element 22, both of substantially nonconductive material, is shown in FIGURE 1. Switch 20, illustrated as a ten position multiposition switch, is mounted by screws 23 to frame members 24 of a chassis (not shown). Rotor 21 is driven from position to position as by the manual knob 25 and drive shaft 26. Detent means (not shown) of a conventional nature may be employed with shaft 26 for holding set switch positions of rotor 21. These set positions of rotor 21 give various operational switch connections between the conductive plates 27*a* and 27*b* mounted on rotor 21 and bridging contactors (or wipers) 28. The bridging contactors 28, which may be sequentially identified in a clockwise direction in FIGURE 1 by symbols C1 through C10, are shown with the bridging contactor 28 at C1 connected to common line 29. The contactor 28 at C2 is connected to a resistance to ground subcircuit 30, at C3 to an inductive subcircuit 31 to ground, at C5 to a capacitive subcircuit 32 to ground, and at other C2 through C10 locations to similar typical subcircuits.

Conductive plates 27*a* and 27*b* are mounted in two parallel planes on the *a* and *b* sides, respectively, of rotor 21. Referring also to FIGURE 2, plates 27*a* and 27*b* are mounted to extend beyond the outer periphery 32 of the circular rotor 21. Plates 27*a* and 27*b* are generally arcuate, at least along their outer peripheries as shown in FIGURE 1 and FIGURES 3–5, and provide sliding contact surfaces for arms 28*a* and 28*b*, respectively, of bridging contactors 28. The arms 28*a* and 28*b* of each contactor 28 are electrically bridged by a conductive metal rivet 33 employed, as shown in FIGURE 2, for mounting the bridging contactors 28 on switch outer element 22. Plates 27*a* and 27*b* in extending beyond the outer periphery 32 of rotor 21 are also helpful in maintaining proper alignment between rotor 21 and switch outer element 22 by engaging opposite sides of radially inwardly extended projections 34 of the outer element 22.

The arcuate conductive plates 27*a* and 27*b* are mounted in their respective planes in endwise relatively narrowly spaced insulated relation along most of the periphery of rotor 21. These plates 27*a* and 27*b* are positioned in their respective planes in such relation that plates of one plane extend in the rotational direction through the associated endwise spacings between plates of the other plane. Plates 27*a* or 27*b* of one plane are also in overlapping spaced insulated relation relative to end-to-end plates of the other plane. There is one relatively widely spaced gap in spacing of the arcuate conductive plates 27*a* and 27*b* in each of their respective planes in order that the switch may have a position, wherein no subcircuits are connected to the common circuit 29, such as shown in FIGURES 3 and 6A.

From the switch position of FIGURES 3 and 6A, clockwise rotation of rotor 21 will carry plates 27*a* and 27*b* successively in predetermined steps of approximately 36° through switch positions progressively adding additional subcircuits in parallel to common circuit 29 as shown in FIGURES 3, 4, and 5. These could all be capacitive subcircuits successively connectable in parallel with the capacitance of line 29, which may be also connected through a capacitor to ground. In FIGURES 4 and 6F the positions of plates 27*a* and 27*b* are shown in the state corresponding to the rotor 21 switch position for connecting five capacitive subcircuits in parallel to common circuit 29. FIGURES 5 and 6J are for the switch position connecting nine capacitive subcircuits in parallel with common circuit 29. FIGURES A through J of FIGURE 6 schematically illustrate the successive switch states for progressively adding subcircuits in parallel with the common circuit 29 through the entire range of operational switch positions provided through each successive 360° rotative cycle of the switch rotor 21. This clearly illustrates how the bridging contactors 28 in cooperation with the overlapping plates *27a* and *27b* progressively add conductive sections to the common circuit 29 in making the connections for adding subcircuits in parallel.

Counter-clockwise rotation of rotor 21 progressively removes subcircuits from connection in parallel with common circuit 29 through the range of operational switch positions provided through each successive 360° counter-clockwise rotative cycle of switch rotor 21. It may be noted that with the bridging contactor 28 in the C10 location only the *28b* arm is required, as illustrated in FIGURES 3 through 6, for successful operation of switch 20. Obviously, other multiposition switches may be provided having other than ten operating positions as provided with switch 20 and still fall within the teachings of the present invention.

Whereas this invention is here illustrated and described with respect to a specific embodiment thereof, it should be realized that various changes may be made without departing from the essential contribution to the art made by the teachings hereof.

I claim:

1. In a switch for progressively connecting multiple individual circuits in parallel, first and second relatively movable switch elements of substantially nonconductive material, structural means interconnecting and guiding relative switching movement between said first and second switch elements, a multiplicity of plates of conductive material mounted on said first switch element in parallel spaced planes which are also parallel to the direction of relative movement between said first and second switch elements, said plates in each plane being in spaced insulated relation in the direction of movement, various of the individual plates of one plane overlapping portions of two adjacent spaced plates respectively of the second plane, a multiplicity of electrical contact wipers mounted on said second switch element, said multiple individual circuits being connected to respective wipers, individual wipers being equipped with two wiper arms, one of said arms being positioned to engage plates in one of said parallel spaced planes, and the other arm being positioned to engage plates in the other of said parallel spaced planes, and various said individual wipers being means providing an electrical bridging connection between a plate in one of said planes to a plate of the other of said spaced planes when both said wiper arms of an individual wiper are in contact with plates of the parallel spaced planes, respectively.

2. In a switch for progressively connecting multiple individual circuits in parallel, first and second relatively movable switch elements of substantially nonconductive material, a multiplicity of plates of conductive material mounted on said first switch element in parallel spaced planes which are also parallel to the direction of relative movement between said first and second switch elements, said plates in each plane being in spaced insulated relation in the direction of relative movement, various of the individual plates of one plane overlapping adjacent spaced plates of the second plane, a multiplicity of electrical contact wipers mounted on said second switch element, individual wipers being equipped with means for engaging plates of both of said parallel spaced planes, and individual wipers being constructed to provide an electrical bridging connection between overlapping plates when simultaneously engaging plates of said parallel spaced planes.

3. In a switch for progressively connecting multiple individual circuits in parallel, first and second relatively movable switch elements of substantially nonconductive material, means maintaining said first and second switch elements in operational switching relation to each other, a multiplicity of plates of conductive material mounted on said first switch element in two parallel paths which are also parallel to the direction of relative movement between said first and second switch elements, said plates being in endwise spaced insulated relation in each of the two parallel paths, various individual plates of one of said paths overlapping adjacent plates and extending across the space between respective adjacent plates of the other said path, at least four electrical contact wipers mounted on said second switch element, said multiple individual circuits being connected to respective wipers, individual wipers being equipped with means for engaging plates of both said parallel paths, and individual wipers being constructed to provide an electrical bridging connection between overlapping plates when simultaneously engaging plates of said parallel paths, and with the switch set for electrically connecting at least four of said individual wipers at least one of said wipers being a necessary electrically conductive bridging link in the circuit path extending to at least one of the other wipers.

4. In a rotary switch for progressively connecting multiple individual circuits in parallel, first and second relatively movable switch elements of substantially nonconductive material; a multiplicity of conductive members mounted on said first switch element in two side-by-side paths with the conductive members of one path insulated from the conductive members of the other path, with the conductive members being in endwise spaced insulated relation in each of the side-by-side paths, and with various individual conductive members of one of said paths overlapping two adjacent conductive members of the other of said paths; a multiplicity of electrical contactors mounted on said second switch element, individual contactors positioned to engage conductive members of both said side-by-side paths, and said individual contactors being constructed to provide electrical bridging connection between overlapping conductive members when simultaneously engaging conductive members of both said side-by-side paths.

5. In an electrical circuit a 360° rotary switch for progressively connecting multiple individual subcircuits in parallel, said rotary switch having first and second relatively movable switch elements of substantially nonconductive material, said first switch element being a rotor, means mounting said rotor for switching movement relatives to said second switch element, a multiplicity of conductive members mounted on said rotor in two side-by-side paths with conductive members of one path insulated from the conductive members of the other path, with the conductive members being in endwise spaced insulated relation in each of the side-by-side paths, and with various individual conductive members of one of said paths overlapping two adjacent conductive members of the other of said paths; a multiplicity of electrical contactors mounted on said second switch element, individual contactors positioned to engage conductive members of both side-by-side paths, said individual contactors being constructed to provide electrical bridging connection between overlapping conductive members when simultaneously engaging conductive members of both said side-by-side paths, said multiple individual subcircuits being connected to respective contactors, and when the switch is set for electrically connecting at least four of said contactors at least one of said contactors being a necessary electrically conductive bridging link in the circuit path extending to at least one of the other contactors.

6. An electrical circuit having multiple individual subcircuits and a switch with, an outer element, of substantially nonconductive material, a rotor, of substantially nonconductive material, means supporting the rotor for 360° repetitive cycles of operation wherein, multiple individual subcircuits are progressively connected in parallel through each 360° repetitive cycle of said rotor in one direction and for progressively disconnecting individual subcircuits through each reverse cycle with rotation of the rotor in the opposite direction; said switch including, a multiplicity of plates, of conductive material, mounted on the rotor in two parallel paths, with the conductive plates of one path insulated from the conductive plates of the other path, with said conductive plates being in endwise spaced insulated relation in each of the two parallel paths, and with various conductive plates of one of said paths overlapping adjacent endwise spaced conductive plates of the other of said paths; a multiplicity of electrical contactors mounted on said outer switch element, with individual contactors positioned to engage conductive plates of both parallel paths, and said individual contactors being constructed to provide electrical bridging connection between overlapping conductive plates when simultaneously engaging conductive plates of the parallel paths; a circuit connection to one of said contactors, and subcircuits connected to the remaining contactors whereby, said subcircuits may be added progressively in parallel to said circuit through successive 360° rotational cycles of said rotor.

References Cited in the file of this patent

UNITED STATES PATENTS

| | | |
|---|---|---|
| 1,205,549 | Kruesheld | Nov. 21, 1916 |
| 2,067,552 | Taylor | Jan. 12, 1937 |
| 2,128,279 | Allison | Aug. 30, 1938 |
| 2,838,623 | Wendling | June 10, 1958 |